United States Patent
Masleid et al.

(12) 
(10) Patent No.: US 6,389,585 B1
(45) Date of Patent: May 14, 2002

(54) METHOD AND SYSTEM FOR BUILDING A MULTIPROCESSOR DATA PROCESSING SYSTEM

(75) Inventors: Robert Paul Masleid, Monte Sereno, CA (US); John Stephen Muhich; Amy May Tuvell, both of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/364,571

(22) Filed: Jul. 30, 1999

(51) Int. Cl.[7] .............................................. G06F 17/50
(52) U.S. Cl. .................. 716/13; 716/2; 716/4
(58) Field of Search .................. 716/2, 4, 13

(56) References Cited

U.S. PATENT DOCUMENTS

| | | | | | |
|---|---|---|---|---|---|
| 5,414,637 A | * | 5/1995 | Bewrtin | ........................ | 716/16 |
| 5,539,652 A | * | 7/1996 | Tegethoff | ..................... | 703/14 |
| 5,543,640 A | * | 8/1996 | Sutherland | ................... | 257/202 |
| 5,808,919 A | * | 9/1998 | Priest | .......................... | 702/183 |
| 5,838,583 A | * | 11/1998 | Varadarajan | ................... | 716/9 |
| 6,123,736 A | * | 9/2000 | Pavisic | .......................... | 716/2 |

* cited by examiner

Primary Examiner—John F. Niebling
Assistant Examiner—Stacy Whitmore
(74) Attorney, Agent, or Firm—Anthony V.S. England; Bracewell & Patterson, L.L.P.

(57) ABSTRACT

A method for building a multiprocessor data processing system is disclosed. A component among a collection of components on a multichip module is identified. The collection of components, which includes both processors and cache components, and each of the components may be functional or non-functional. A determination is made as to whether or not the identified component is functional. In response to a determination that the identified component is functional, the process of component association is performed between the identified component and other functional components on the multichip module such that interconnect length between all functional components can be minimized.

15 Claims, 3 Drawing Sheets

Px - Processor components
Lx - Cache components

|     | L3   | L3   | P3   | L3   | L3   |     |
| --- | ---- | ---- | ---- | ---- | ---- | --- |
| L4  | L3S2 | L3   | L3   | L3   | L2S2 | L2  |
| L4  | L4   | L4S1 | L3   | L3S1 | L2   | L2  |
| P4  | L4   | L4   | P5   | L2   | L2   | P2  |
| L4  | L4   | L1S1 | L1   | L2S1 | L2   | L2  |
| L4  | L4S2 | L1   | L1   | L1   | L1S2 | L2  |
|     | L1   | L1   | P1   | L1   | L1   |     |

Px - Processor components
Lx - Cache components
LxSx - Spare cache components

*Fig. 3*

METHOD AND SYSTEM FOR BUILDING A MULTIPROCESSOR DATA PROCESSING SYSTEM

BACKGROUND OF THE INVENTION

1. Technical Field

The present invention relates to a method and system for manufacturing data processing systems in general, and in particular to a method and system for manufacturing a multiprocessor data processing system. Still more particularly, the present invention relates to a method and system for building a multiprocessor data processing system on a multichip module.

2. Description of the Prior Art

A multiprocessor (MP) data processing system typically includes at least two processors along with several cache components per processor. An MP data processing system can be built in a multichip module (MCM) by combining various functional components, such as those mentioned above, that are all fabricated on a single semiconductor wafer.

Because the cost of rework and test time has been increasing, the rework of an MCM is becoming technically inviable. Thus, redundancy is typically included on an MCM to avoid rework costs and technical problems. Redundancy can be provided by including additional components that are beyond the number of components needed within the MCM in which an MP data processing system is built. Thus, when building an MP data processing system on an MCM, one challenge is to define the association between functional processor components and their respective cache components while retaining optimal wiring paths within the MCM. The present disclosure provides an improved method and system for building an MP data processing system in an MCM.

SUMMARY OF THE INVENTION

In accordance with a preferred embodiment of present invention, a component among a collection of components on a multichip module is identified. The collection of components, which includes both processors and cache components, and each of the components may be functional or non-functional. A determination is made as to whether or not the identified component is functional. In response to a determination that the identified component is functional, the process of component association is performed between the identified component and other functional components on the multichip module such that interconnect length between all functional components can be minimized.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 3 is a pictorial diagram of a second arrangement of components in a multichip module, in accordance with an alternative embodiment of the invention.

DETAILED DESCRIPTION OF A PREFERRED EMBODIMENT

According to the prior art, the steps for building a multiprocessor (MP) data processing system on a multichip module (MCM) are as follows:

1. test all components on a semiconductor wafer (or an MCM) that includes both processors and cache components;
2. lookup configuration options according to the pattern of components that passed the component test in step 1; and
3. set configuration option for the MCM or conclude that the MCM is non-functional.

Figure 1:
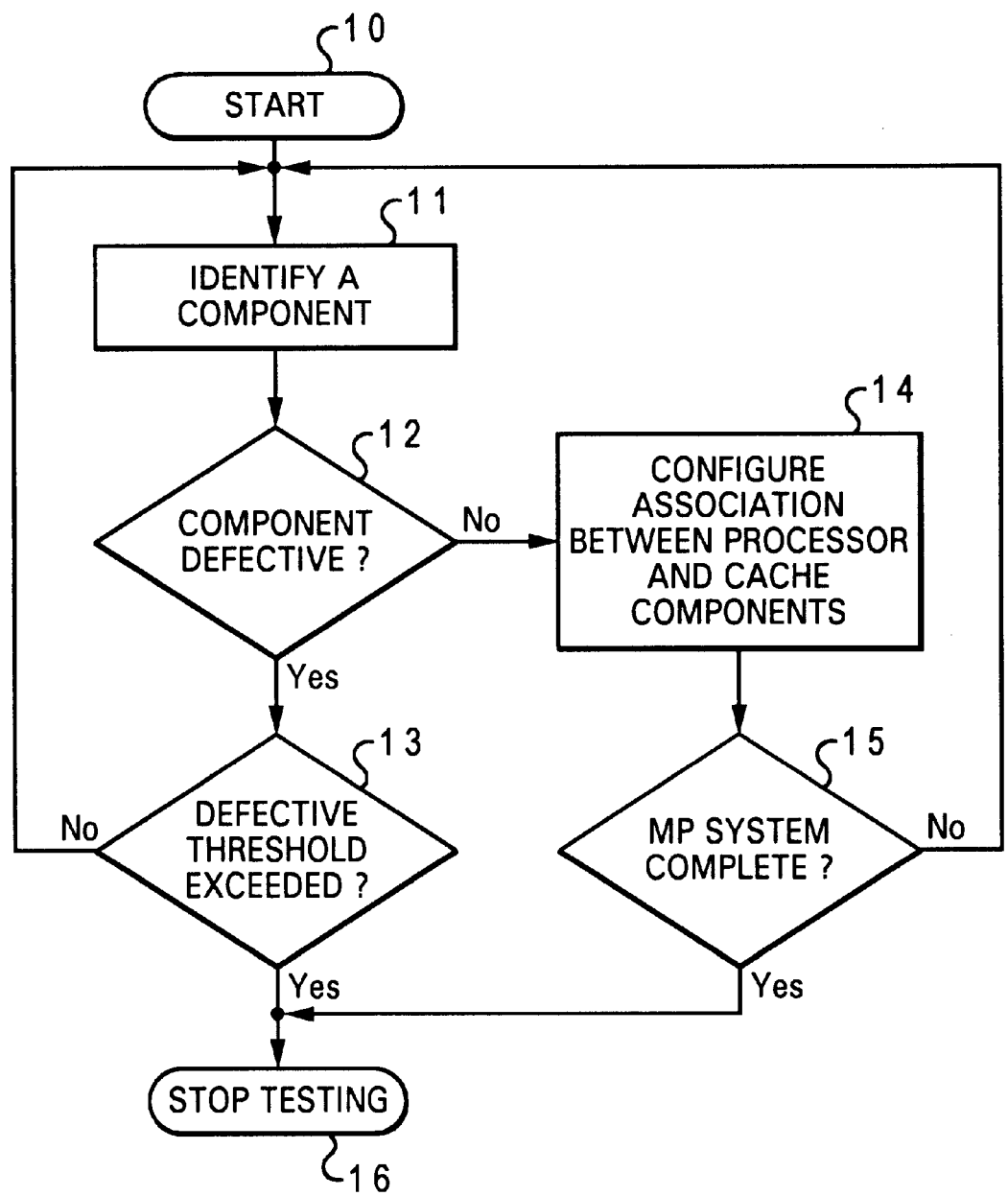
FIG. 1 is a high-level logic flow diagram of a method for building an MP data processing system on a multichip module, in accordance with a preferred embodiment of the present invention.

Referring now to the drawings and specifically to FIG. 1, there is depicted a high-level logic flow diagram of a method for building an MP data processing system on an MCM, in accordance with a preferred embodiment of the present invention. Starting at block 10, a component is identified from among a collection of components formed on a substrate, as shown in block 11. The collection of components includes processors and cache components that each may be functional and non-functional, depending on the yield of the fabrication process. The substrate can be a semiconductor wafer, an MCM, or other types of packaging material. A determination is then made as to whether or not the component identified in block 11 is defective, as depicted in block 12.

If the component identified in block 11 is determined to be defective, then a second determination is made as to whether or not a defect threshold has been exceeded such that it is not possible to build a fully functional MP data processing system on that particular MCM, as shown in block 13. If the defect threshold has been exceeded, the MCM is concluded to be non-functional and the testing can be stopped at that point, as illustrated in block 16. Otherwise, if the defect threshold has not been exceeded, the process returns to block 11 to identify another component from among the collection of components.

If the component identified in block 11 is determined in block 12 to be functional such that it is possible to progress towards building the fully functional MP data processing system by including the identified component, then configure association with a particular processor/cache group by blowing a fuse or by utilizing other configuration mechanism, as shown in block 14. Another determination is made as to whether or not the MP data processing system is completed, as depicted in block 15. If the MP data processing system is not completed yet, the process returns to block 11 for another component in the collection of components; otherwise, the testing is stopped at block 16.

For the purpose of illustration, an MP data processing system in the present disclosure contains four processors (N=4) and eight cache components (C=8) per processor for each functional MP data processing system. In addition, a 25% redundancy is included for both processors and cache components (i.e., n=1, c=8) within each functional MP data processing system. Hence, an MCM on which the MP data processing system is built contains a total of 45 elements, of which 36 of them will be actually used in a functional MP data processing system. However, it is understood by those skilled in the art that an MP data processing system may contain any number of processors and cache components.

Figure 2:
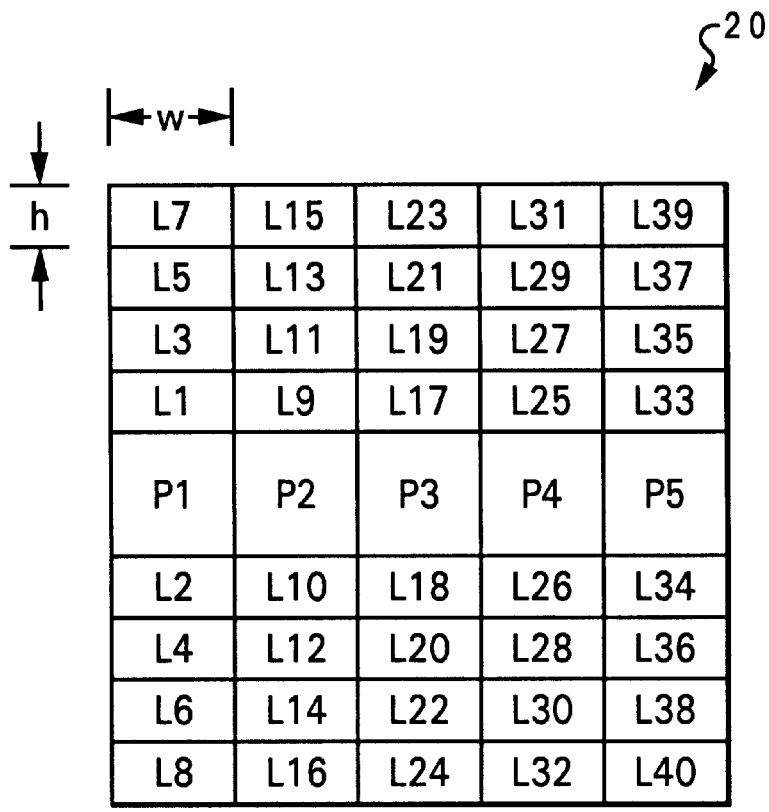
FIG. 2 is a pictorial diagram of a first arrangement of components in a multichip module, in accordance with a preferred embodiment of the invention.

In accordance with a preferred embodiment of the present invention, the assignment method and test order may be optimized for a rectangular arrangement of components, including both processors and cache components, on an MCM 20, as depicted in FIG. 2. As shown, processors P1 to P5 and cache components L1 to L40 are numerically labelled. All processors P1 to P5 are arranged in a serial manner, and cache components L1 to L40 are arranged in an orthogonal direction to processors P1 to P5.

With the rectangular arrangement of components as depicted in FIG. 2, the maximum cache-to-processor distance is 1 to 4 cache heights (h) if all cache components within MCM 20 are good. Otherwise, the maximum cache-to-processor distance would be 1 cache width (w) plus 1 cache height to 1 cache width plus 4 cache heights in the worst case scenario when cache component L1 to cache component L8 are non-functional, and processor P1 must be used to form a functional MP data processing system on MCM 20.

Each processor and each cache component is tested in numeric order according to the testing sequence described in pseudo-code as depicted in Table I.

TABLE I

```
Proc_fails=0;
Cache_fails=0;
Last_tested_cache=0;
N=4 (number of functional processor needed)
n=1 (number of spare processor available)
C=8 (number of functional caches per processor needed)
c=8 (number of spare caches available)
For i=1 to N+n
    If i > N+Proc_fails, abort;    (enough functional processors found)
    Test processor (i);
    If fails
        Proc_fails = Proc_fails+1;
        If Proc_fails > n, abort;
    If passes
        For j=1 to C
            Test cache (Last_tested_cache+1);
            If fails Cache_fails=Cache_fails+1 and j=j −1;
            If Cache_fails>c abort;
            If passes assign cache (Last_tested_cache + 1)
                to processor (i);
            Last_tested_cache=Last_tested_cache + 1;
        end; (for j)
    end; (if passes)
end; (for i).
```

As a figure of merit for the quality of the assignment resulting from the above pseudo-code, the minimum distance between components and variance of distances can be specified for comparison to other possible assignments. For the arrangement as shown in FIG. 2, the processor-to-processor distance is 1 to 3 processor widths if all processors P1–P5 are functional or processor P5 is non-functional or processor P1 is non-functional. Otherwise, the processor-to-processor distance is 1 to 4 processor widths if processor P2, processor P3, or processor P4 is non-functional. The ideal processor-to-processor distance is 1 to 3 processor widths.

As an alternative embodiment of the present invention, the assignment method and test order can be optimized for a square arrangement of components on an MCM 30, as depicted in FIG. 3. As shown, processors P1 to P5 are numerically labelled and are arranged in a "cross" pattern. The components are tested in numeric order per a testing sequence described in pseudo-code as depicted in Table II.

TABLE II

```
Proc_fails=0;
Cache_fails=0;
Last_tested_cache=0;
N=4 (number of functional processor needed)
n=1 (number of spare processor available)
C=8 (number of functional caches per processor needed)
c=8 (number of spare caches available)
For i=1 to N
    Test processor (i);
    If fails
        Proc_fails = Proc_fails+1
        If Proc_fails > n, abort;
        Test processor N + Proc_fails; (in this example P5)
        If fails
            Proc_fails=Proc_fails+1;
            If Proc_fails > n, abort;
        If passes (alt processor test)
            Alt_processor_L3_assignment;
            (subroutine pseudo-code after primary processor
                            L3 assignment diag.)
        end; (if fails)
    If passes (primary processor L3 assignment)
        For j=1 to C
            Test cache (j); (Order shown in diagram of primary
                processor L3 assignment is
                    only an example.)
            If fails
                Cache_fails = Cache_fails+1;
                If Cache_fails > cN abort;
                For s=1 to c/N
                    Test spare_cache(s);
                    If fails
                        Cache_fails=Cache_fails+1;
                        If Cache_fails > c/N, abort;
                end; (for s)
            If passes assign cache (j) to processor(i);
        end; (for j)
    end; (if passes)
end; (for i)
Alt_processor_L3_assignment; (subroutine)
    For a=1 to C
        Test cache (a); (Order shown in diagram of alternate
            processor L3 assignment is
                    only an example.)
        If fails
            Cache_fails=Cache_fails+1;
            If Cache_fails > c/N abort;
        For s=1 to c/N
            Test spare_cache(s);
            If fails
                Cache_fails = Cache_fails+1;
                If Cache _fails>c/N abort;
        end; (for s)
        If passes assign cache (a) to processor (N+Proc_fails);
    end; (for a).
```

As a figure of merit for the quality of assignment result from the above pseudo-code, the minimum distance between components and variance of distances can be specified for comparison to other possible assignments. For the arrangement as shown in FIG. 3, the processor-to-cache distance is 1 to 2 processor widths if all primary processors are functional and no spare cache components need to be used and 1 to 3 processor widths if spare cache components must be used. If processor P5 (an alternate) is used, the processor-to-cache distance is 1 to 4 processor widths. But if spare cache components are used, then the processor-to-cache distance becomes 1 to 5 processor widths. The ideal processor-to-cache distance is 1 to 2 processor widths. Processor-to-processor distance is 6 processor widths for a system containing all primary processors, and 3 to 6 processor widths if the alternate processor is used. The ideal processor-to-processor distance is 3 to 6 processor widths if minimum processor-to-processor distance is desired.

As has been described, the present invention provides an improved method for building a multiprocessor system.

With the present invention, the test time is reduced because the process of component associations is performed as functional components are defined rather than being performed after all components have been tested. In addition, the test time is shortened because a failing MCM is identified as soon as the number of failing components of a certain type exceed the number of spares.

The functional testing described in the present invention preferably occurs after the attachment of components to an MCM. These components may have been tested prior to assembly such that the above-mentioned functional testing is intended on identifying components that are non-functional as a result of the assembly. Although the above-mentioned functional testing may be performed as an initial test of components, it is a less likely scenario.

The process of component association is performed immediately following the functional test of the component is very important because the component configuration and thus the relationship among components is fully determined prior to the continuation testing of the next component. The value of the present invention is gauged by how closely this association comes to the ideal which can be more easily achieved by the prior art which knows the pass/fail status of all component before any component association is established. Thus, the configuration choice becomes a function of the functionality of the component and its test order rather than a lookup table with an entry for all test outcomes.

Figure 4:
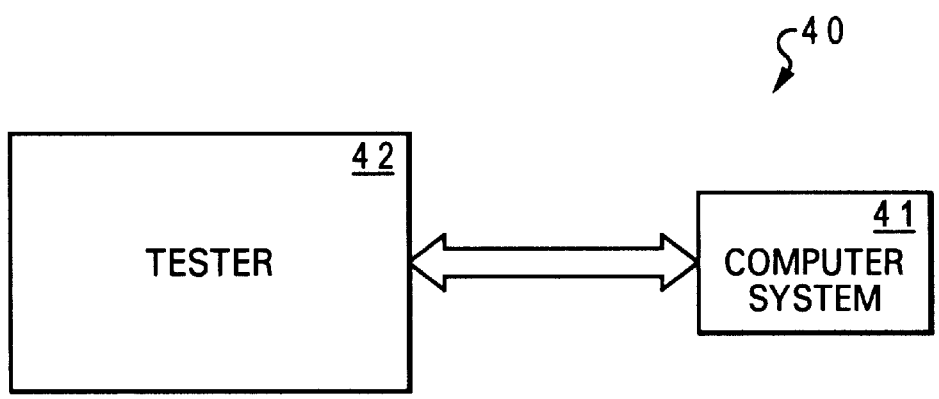
FIG. 4 is a block diagram of a multichip module testing system in which a preferred embodiment of the present invention is implemented.

With reference now to FIG. 4, there is depicted a block diagram of an MCM testing system in which a preferred embodiment of the present invention is implemented. As shown, an MCM testing system 40 includes a computer system 41 and a tester 42. Computer system 41, where the computer program code for the preferred method of the present invention can be executed, is utilized to control each functional testing performed by tester 42.

It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for building a multiprocessor data processing system on a multichip module, said method comprising:

identifying a component from a collection of components situated on a multichip module, wherein any of said components may be either functional or non-functional;

determining whether or not said identified component is functional;

in response to a determination that said identified component is non-functional, determining whether or not a defect threshold of associated components has been exceeded, wherein said defect threshold defines a value above which a functional multiprocessor data processing system cannot be built on said multichip module; and in response to a determination that said identified component is functional, configuring a connective association between said identified component and other associated functional components on said multichip module such that interconnect length between associated functional components can be minimized.

2. The method according to claim 1, wherein said method further includes a step of concluding that said multichip module is non-functional and stopping testing, in response to a determination that said defect threshold has been exceeded.

3. The method according to claim 1, wherein said method further includes a step of identifying another component from said collection of components situated on said multichip module, in response to a determination that said defect threshold has not been exceeded.

4. The method according to claim 1, wherein said collection of components situated on said multichip module includes a plurality of processors and a plurality of cache memories.

5. The method according to claim 4, wherein said plurality of processors is arranged in a linear configuration.

6. The method according to claim 4, wherein said plurality of processors is arranged in a "cross" configuration.

7. A computer program product residing on a computer usable medium for building a multiprocessor data processing system on a multichip module, said computer program product comprising:

program code means for identifying a component from a collection of components situated on a multichip module, wherein any of said components may be either functional or non-functional;

program code means for determining whether or not said identified component is functional;

program code means for determining whether or not a defect threshold of associated components has been exceeded, wherein said defect threshold defines a value above which a functional multiprocessor data processing system cannot be built on said multichip module, in response to a determination that said identified component is non-functional; and program code means for configuring a connective association between said identified component and other associated functional components on said multichip module, in response to a determination that said identified component is functional, such that interconnect length between associated functional components can be minimized.

8. The computer program product according to claim 7, wherein said computer program product further includes a program code means for concluding that said multichip module is non-functional and stopping testing, in response to a determination that said defect threshold has been exceeded.

9. The computer program product according to claim 7, wherein said computer program product further includes a program code means for identifying another component from said collection of components situated on said multichip module, in response to a determination that said defect threshold has not been exceeded.

10. The computer program product according to claim 7, wherein said collection of components situated on said multichip module includes a plurality of processors and a plurality of cache memories.

11. The computer program product according to claim 10, wherein said plurality of processors is arranged in a linear configuration.

12. The computer program product according to claim 10, wherein said plurality of processors is arranged in a "cross" configuration.

13. A testing system for building a multiprocessor data processing system on a multichip module, said testing system comprising:

means for identifying a component from a collection of components situated on a multichip module, wherein any of said components may be either functional or non-functional;

means for determining whether or not said identified component is functional;

means for determining whether or not a defect threshold of associated components has been exceeded, wherein said defect threshold defines a value above which a functional multiprocessor data processing system cannot be built on said multichip module, in response to a determination that said identified component is non-functional; and means for configuring a connective association between said identified component and other associated functional components on said multichip module, in response to a determination that said identified component is functional, such that interconnect length between associated functional components can be minimized.

14. The testing system according to claim 13, wherein said testing system further includes a means for stopping testing, in response to a determination that said defect threshold has been exceeded.

15. The testing system according to claim 13, wherein said testing system further includes a means for identifying another component from said collection of components situated on said multichip module, in response to a determination that said defect threshold has not been exceeded.

* * * * *